(12) United States Patent
Murayama

(10) Patent No.: US 10,943,343 B2
(45) Date of Patent: Mar. 9, 2021

(54) EVALUATION METHOD, DETERMINATION METHOD, LITHOGRAPHY APPARATUS, AND NON-TRANSITORY COMPUTER-READABLE STORAGE MEDIUM

(71) Applicant: CANON KABUSHIKI KAISHA, Tokyo (JP)

(72) Inventor: Genki Murayama, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/159,909

(22) Filed: Oct. 15, 2018

(65) Prior Publication Data
US 2019/0122358 A1 Apr. 25, 2019

(30) Foreign Application Priority Data
Oct. 19, 2017 (JP) .............................. JP2017-202857

(51) Int. Cl.
*G06T 7/00* (2017.01)
*G06T 7/73* (2017.01)
(Continued)

(52) U.S. Cl.
CPC ........ *G06T 7/0004* (2013.01); *G03F 7/70625* (2013.01); *G03F 7/70633* (2013.01);
(Continued)

(58) Field of Classification Search
CPC ......... G06T 2207/30148; G06T 7/0004; G06T 7/73; G06T 5/002; G06T 5/20;
(Continued)

(56) References Cited

U.S. PATENT DOCUMENTS 6,693,713 B1 * 2/2004 Nakajima ............. G03F 9/7088
356/400
2003/0130812 A1 7/2003 Haginiwa
(Continued)

FOREIGN PATENT DOCUMENTS

CN 102053490 A 5/2011
JP 2008166737 A 7/2008

OTHER PUBLICATIONS

Office Action issued in Chinese Appln. No. 201811199388.7 dated Dec. 3, 2020. English machine translation provided.

*Primary Examiner* — Margaret G Mastrodonato
(74) *Attorney, Agent, or Firm* — Rossi, Kimms & McDowell LLP

(57) ABSTRACT

The present invention provides an evaluation method of evaluating a measurement condition of a position of a mark formed on a substrate, the method comprising: obtaining a mark signal representing an intensity distribution of reflected light by detecting the reflected light from the mark under the measurement condition; generating a plurality of signals from the mark signal by changing a first signal component of a first frequency included in the mark signal obtained in the obtaining; and estimating a position of the mark from each of the plurality of signals obtained in the generating, and obtaining a variation in estimated position of the mark as an evaluation index of the measurement condition.

13 Claims, 9 Drawing Sheets

(51) Int. Cl.
  *G06T 5/00* (2006.01)
  *G03F 7/20* (2006.01)
  *G06T 5/20* (2006.01)
  *G03F 9/00* (2006.01)

(52) U.S. Cl.
  CPC ............ *G03F 9/7092* (2013.01); *G06T 5/002* (2013.01); *G06T 5/20* (2013.01); *G06T 7/73* (2017.01); *G06T 2207/30148* (2013.01); *G06T 2207/30204* (2013.01)

(58) Field of Classification Search
  CPC ....... G06T 2207/30204; G03F 7/70633; G03F 9/7088; G03F 9/7092; G03F 7/70625
  See application file for complete search history.

(56) References Cited

U.S. PATENT DOCUMENTS

| | | | | |
|---|---|---|---|---|
| 2006/0221322 | A1* | 10/2006 | Tinnemans | G03F 7/70291 355/69 |
| 2008/0129972 | A1* | 6/2008 | Egashira | G03F 9/7088 355/53 |
| 2009/0108483 | A1* | 4/2009 | Suehira | B82Y 10/00 264/40.5 |
| 2015/0011026 | A1* | 1/2015 | Oishi | H01L 22/20 438/14 |
| 2017/0235232 | A1* | 8/2017 | Toshima | G03F 7/70633 355/72 |

* cited by examiner

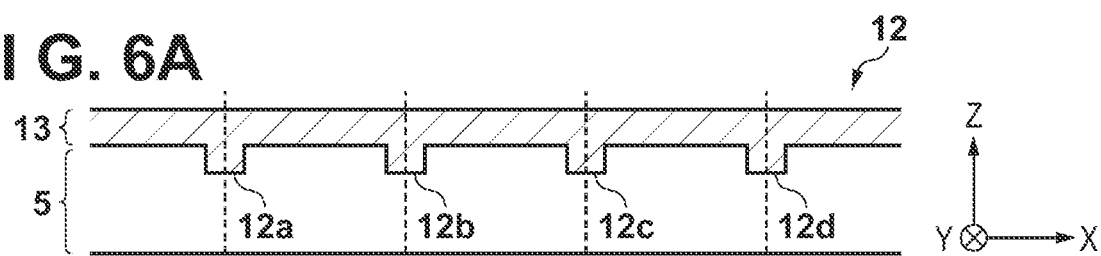
F I G. 6A
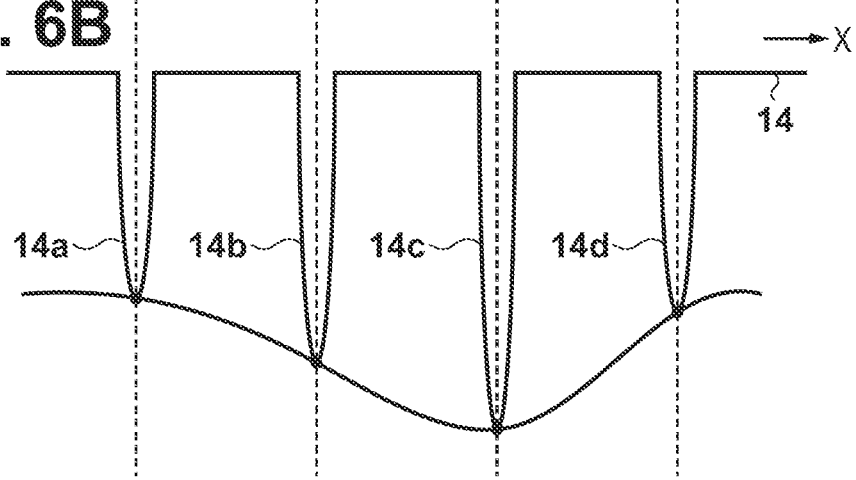
F I G. 6B

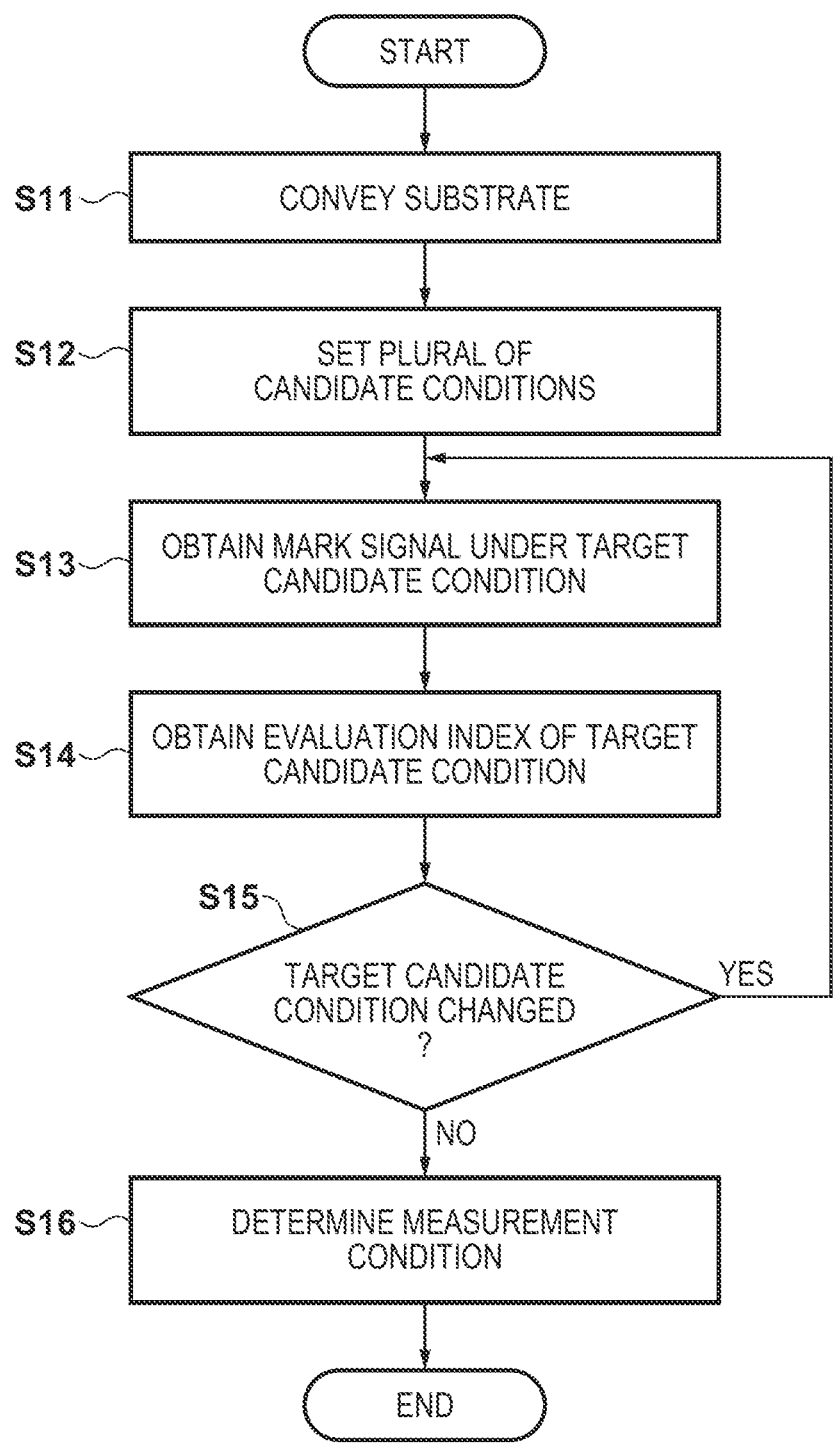

THIS EMBODIMENT

CONVENTIONAL EXAMPLE

US 10,943,343 B2

EVALUATION METHOD, DETERMINATION METHOD, LITHOGRAPHY APPARATUS, AND NON-TRANSITORY COMPUTER-READABLE STORAGE MEDIUM

This application claims the benefit of Japanese Patent Application No. 2017-202857 filed on Oct. 19, 2017, which is hereby incorporated by reference herein in its entirety.

BACKGROUND OF THE INVENTION

Field of the Invention

The present invention relates to an evaluation method of evaluating a measurement condition of the position of a mark formed on a substrate, a determination method, a lithography apparatus, and a non-transitory computer-readable storage medium.

Description of the Related Art

In a lithography apparatus used to manufacture a semiconductor device or the like, along with miniaturization and an increase in packing density of circuit patterns, positioning a substrate with high accuracy based on a measurement result of the position of a mark formed on the substrate is required. However, a measurement result of the position of a mark on a substrate may include a measurement error (to be sometimes referred to as WIS (Wafer Induced Shift)) caused by a substrate manufacturing process, such as the thickness non-uniformity of a resist applied on the substrate. Hence, in an exposure apparatus, it is preferable to measure the position of a mark on a substrate under a measurement condition in which such a measurement error is reduced. Japanese Patent Laid-Open No. 2008-166737 proposes a method of generating, for each of a plurality of measurement conditions, a correlation between the measurement error and the feature amount (asymmetry, contrast, or the like) of a mark signal representing the intensity distribution of light reflected by a mark on a substrate, thereby determining a measurement condition used for actual measurement based on the correlation.

Since the measurement error caused by a substrate manufacturing process may be different between a plurality of marks formed on a substrate, sequentially determining a measurement condition for each of the plurality of marks using the method described in Japanese Patent Laid-Open No. 2008-166737 is complicated. Therefore, it is preferable to determine a measurement condition so as to be used for a plurality of marks in common, that is, so as to have high robustness, and a method of evaluating the robustness of a measurement condition is required.

SUMMARY OF THE INVENTION

The present invention provides a technique advantageous in, for example, evaluating the robustness of a measurement condition.

According to one aspect of the present invention, there is provided an evaluation method of evaluating a measurement condition of a position of a mark formed on a substrate, the method comprising: obtaining a mark signal representing an intensity distribution of reflected light by detecting the reflected light from the mark under the measurement condition; generating a plurality of signals from the mark signal by changing a first signal component of a first frequency included in the mark signal obtained in the obtaining; and estimating a position of the mark from each of the plurality of signals obtained in the generating, and obtaining a variation in estimated position of the mark as an evaluation index of the measurement condition.

Further features of the present invention will become apparent from the following description of exemplary embodiments with reference to the attached drawings.

BRIEF DESCRIPTION OF THE DRAWINGS

FIG. 6A is a cross sectional view showing the example of the mark formed on the substrate;

FIG. 6B is a view showing a mark signal actually obtained from the mark shown in FIG. 6A;

FIG. 7 is a flowchart showing a determination method of a measurement condition;

DESCRIPTION OF THE EMBODIMENTS

Figure 1:
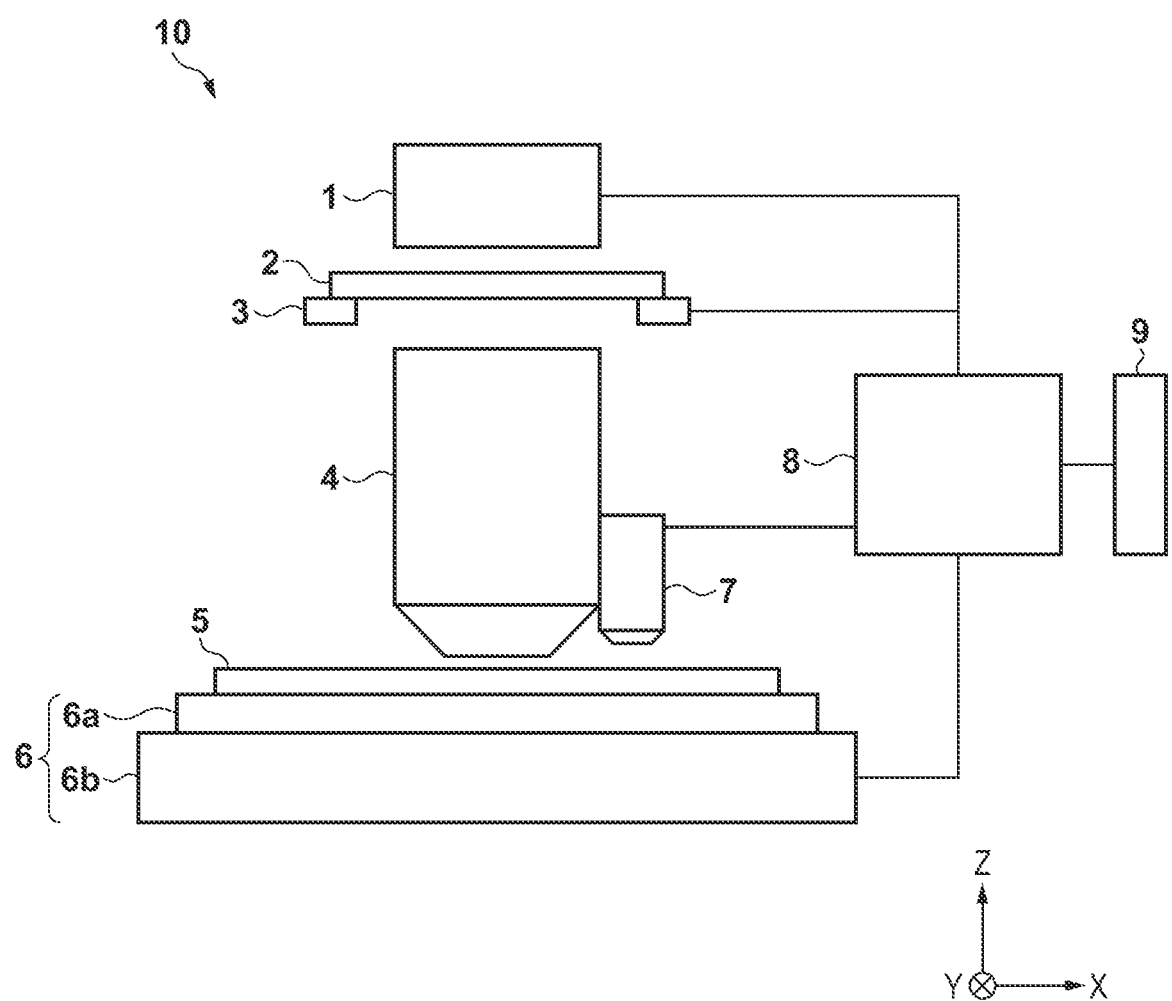
FIG. 1 is a schematic view showing the arrangement of an exposure apparatus.

Exemplary embodiments of the present invention will be described below with reference to the accompanying drawings. Note that the same reference numerals denote the same members throughout the drawings, and a repetitive description thereof will not be given. In the embodiments described below, a case in which an exposure apparatus that performs exposure for a substrate to transfer the pattern of a mask on it is used as a lithography apparatus will be described. However, the lithography apparatus is not limited to this. The present invention is also applicable to the lithography apparatus such as an imprint apparatus that uses a mold to form the pattern of an imprint material on a substrate, or a drawing apparatus that irradiates a substrate with a charged particle beam to form a pattern on the substrate.

First Embodiment

An exposure apparatus 10 of the first embodiment according to the present invention will be described. FIG. 1 is a schematic view showing the arrangement of the exposure apparatus 10. The exposure apparatus 10 can include an illumination optical system 1, a mask stage 3, a projection optical system 4, a substrate stage 6, a measurement unit 7, and a control unit 8. The control unit 8 includes a computer including, for example, a CPU and a memory (storage unit), and controls exposure processing in the exposure apparatus 10 (controls each unit of the exposure apparatus 10).

The illumination optical system 1 shapes light emitted from a light source (not shown) and illuminates a mask 2 held by the mask stage 3. The projection optical system 4 has a predetermined projection magnification, and projects the circuit pattern of the mask 2 illuminated by the illumination optical system 1 onto a substrate 5. The substrate stage 6 is configured to be movable while holding the substrate 5. More specifically, the substrate stage 6 can include a chuck 6a that holds the substrate 5 with an underlayer pattern and a mark 12 (alignment mark) formed in a preceding process, and a driving unit 6b that mechanically holds the chuck 6a and drives the substrate 5 with the chuck 6a. The measurement unit 7 includes a scope (detection unit) that detects light reflected by the mark 12 formed on the substrate 5, and measures the position of the mark 12 based on a mark signal (the image signal of the mark 12) representing the intensity distribution of the reflected light detected by the detection unit. The measurement unit 7 of this embodiment uses as a scope an off-axis scope that detects the mark 12 on the substrate 5 without intervening the projection optical system 4.

Figure 2:
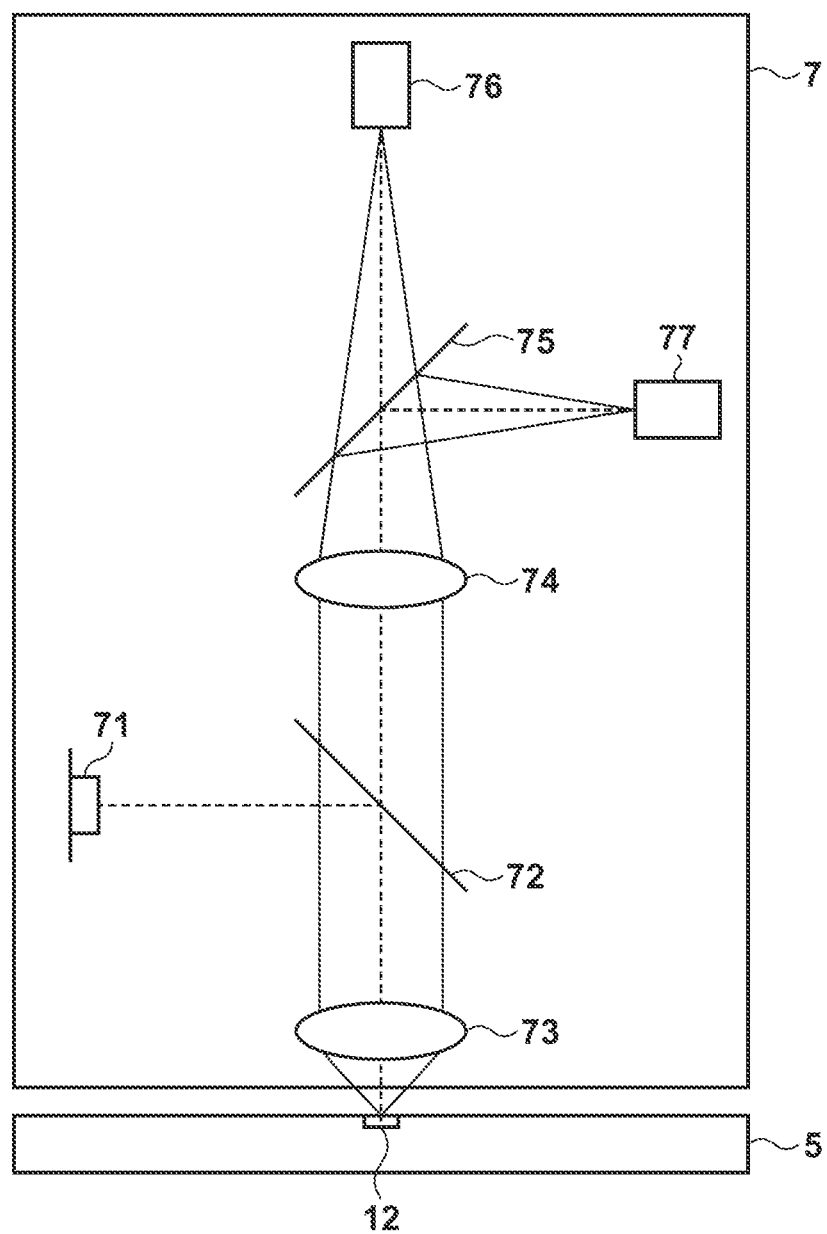
FIG. 2 is a schematic view showing the arrangement of a measurement unit (scope)

The more specific arrangement of the measurement unit 7 (scope) will be described next. FIG. 2 is a schematic view showing the arrangement of the measurement unit 7 (scope). Illumination light from a light source 71 is reflected by a beam splitter 72 and passes through a lens 73, thereby illuminating the mark 12 on the substrate 5. The light reflected by the mark 12 passes through the lens 73, the beam splitter 72, and a lens 74 and is divided by a beam splitter 75, thereby being received by image sensors 76 and 77. The image sensor is a sensor having an image capturing element (for example, a CMOS or CCD). The image of the mark 12 is enlarged by the lenses 73 and 74 at a magnification with which the resolution of the image can satisfy the measurement accuracy, and is formed on the light receiving surfaces of the image sensors 76 and 77. The image sensors 76 and 77 are used for measuring the X- and Y-direction positions of the mark 12, respectively, and arranged to be rotated 90° with respect to an optical axis.

Figure 3:
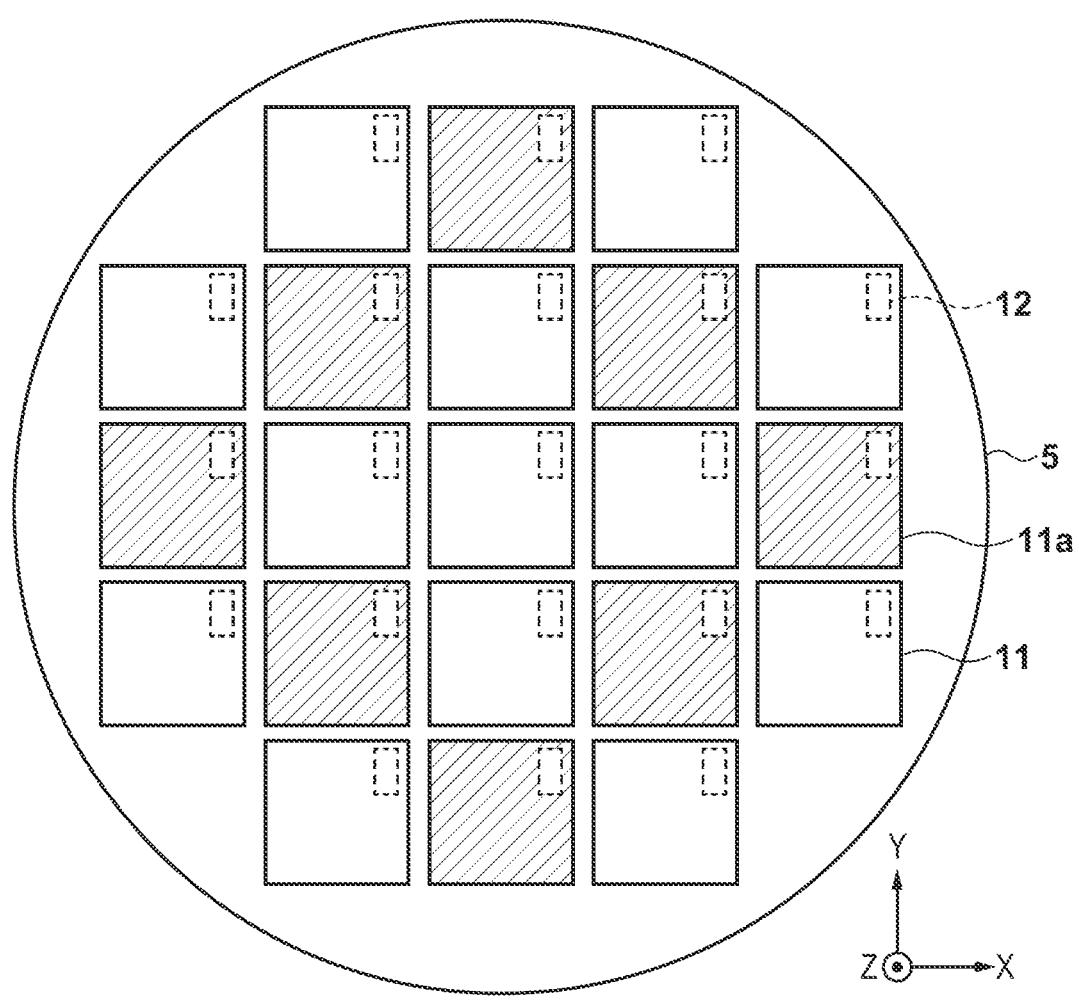
FIG. 3 is a view showing an example of the arrangement of sample shot regions.

FIG. 3 is a view showing the arrangement of a plurality of shot regions 11 on the substrate. Each shot region 11 can be provided with a mark for measuring the X-direction position and a mark for measuring the Y-direction position. Since these marks are the same in shape and simply different in angle by 90°, only the mark 12 for measuring the X-direction position is shown in FIG. 3. The exposure apparatus 10 performs mark position measurement in some shot regions (sample shot regions 11a) among the plurality of shot regions 11. When statistically processing the measurement results of the positions of the marks 12 in the sample shot regions 11a, information about arrangement of the plurality of shot regions 11 on the substrate 5 can be obtained (so-called global alignment). Information about arrangement can include information of a deviation amount from a target arrangement.

Figure 4A:
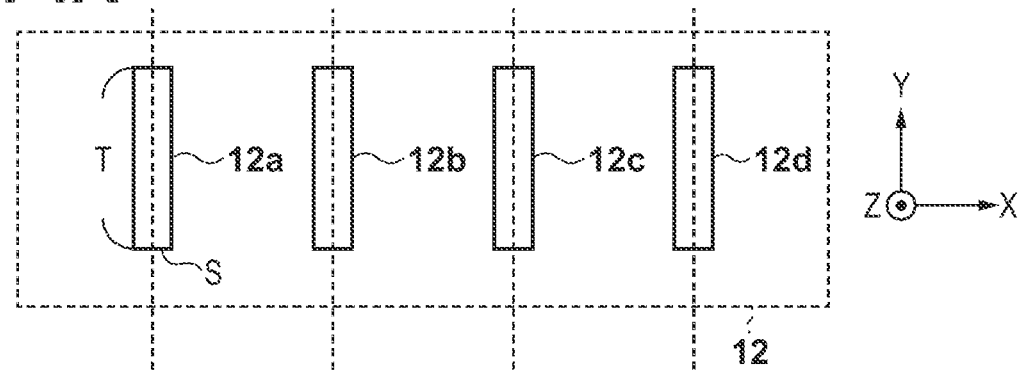
FIG. 4A is a top view showing an example of a mark formed on a substrate.
Figure 4B:
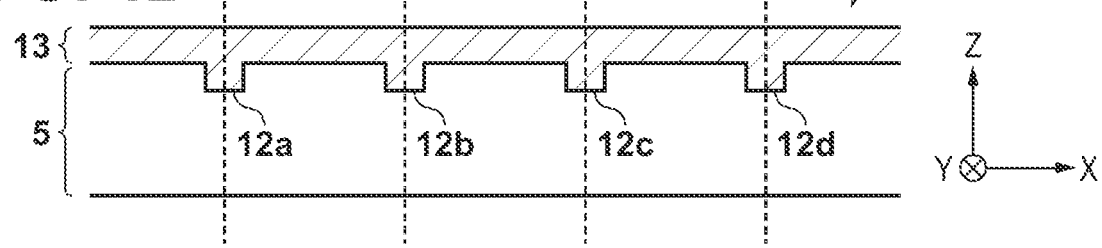
FIG. 4B is a cross sectional view showing the example of the mark formed on the substrate.

FIGS. 4A and 4B are views showing an example of the mark 12 formed on the substrate 5 (each shot region 11). FIG. 4A is a top view of the mark 12 when viewed from the above (Z direction), and FIG. 4B is an X-Z cross sectional view of the mark 12. As shown in FIGS. 4A and 4B, the mark 12 can include, for example, a line and space pattern in which a plurality (four) of line elements 12a to 12d, each having a short side S in the measurement direction (X direction) and a long side T in the non-measurement direction (Y direction), are placed evenly spaced apart in the X direction. Each of the line elements 12a to 12d is formed to have a concave shape by etching or the like, and the bottom surface of each of the line elements 12a to 12d can be provided with a material such as chromium, whose light reflectance is different from that of the surface of the substrate 5. In the example shown in FIG. 4B, a resist 13 is applied (dispensed, coated) on the mark 12 (the plurality of line elements 12a to 12d) on the substrate 5.

Figure 5A:
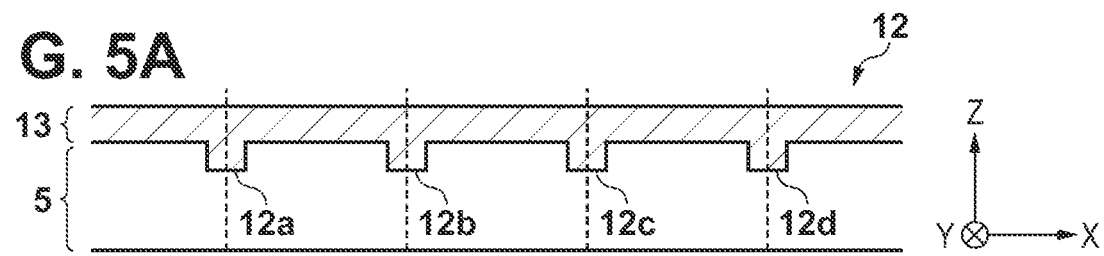
FIG. 5A is a cross sectional view showing the example of the mark formed on the substrate.
Figure 5B:
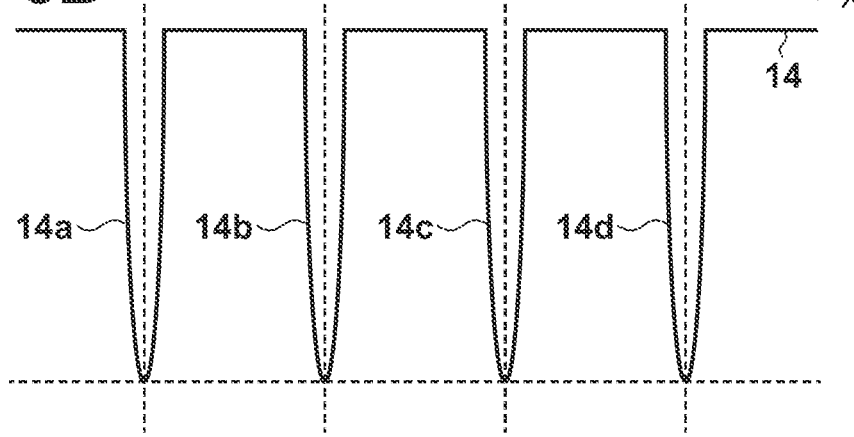
FIG. 5B is a view showing an ideal mark signal obtained from the mark shown in FIG. 5A.

FIGS. 5A and 5B show an example of an ideal mark signal 14 (FIG. 5B) obtained by detecting (receiving) light reflected by the mark 12 (FIG. 5A) arranged as shown in FIGS. 4A and 4B by the image sensor 76 and converting the intensity of the detected reflected light into an electrical signal. When illuminating the mark 12 on the substrate 5, because of the difference between the light reflectance of the surface of the substrate 5 and that of the bottom surface of each of the line elements 12a to 12d, the intensity of the light reflected by the surface of the substrate 5 and the intensity of the light reflected by each of the line elements 12a to 12d differ from each other. Hence, in the mark signal 14 representing the intensity distribution of the light reflected by the mark 12, as shown in FIGS. 5A and 5B, signal intensity changing portions (depressions) 14a to 14d can be observed at positions corresponding to the line elements 12a to 12d. By obtaining the peak positions of the signal intensity changing portions 14a to 14d, the position (coordinate) of the mark 12 can be measured (calculated) based on the peak positions of the changing portions 14a to 14d.

However, the mark signal 14 shown in FIG. 5B is an ideal example, and in practice, the intensity of reflected light can be different between the line elements 12a to 12d because of the manufacturing process of the substrate 5 (for example, the thickness non-uniformity of the resist 13). As a result, the peak value can be different between the changing portions 14a to 14d as shown in FIGS. 6A and 6B. FIG. 6A shows a cross sectional view of the mark 12, and FIG. 6B shows an example of a mark signal that can be obtained in practice. When the peak values of the changing portions 14a to 14d in the mark signal 14 differ from each other, it is difficult to accurately obtain the peak positions of the changing portions 14a to 14d, and therefore an error can occur in measurement result of the position of the mark 12. Hence, the exposure apparatus 10 preferably measures the position of the mark 12 on the substrate 5 under a measurement condition in which such a measurement error is reduced. In addition, since such a measurement error can differ between the plurality of marks 12 formed on the substrate 5, it is preferable to determine a measurement condition so as to be used for the plurality of marks 12 in common, that is, so as to have high robustness.

[Determination Method of Measurement Condition]

A determination method of a measurement condition according to this embodiment will be described below with reference to FIG. 7. FIG. 7 is a flowchart showing a determination method of a measurement condition according to this embodiment. Each step of the flowchart shown in FIG. 7 can be performed by the control unit 8. A case in which the control unit 8 functions as a processing unit that performs processing (S12 to S16) of determining a measurement condition will be described in this embodiment, but, the processing unit may be provided separately from the control unit 8.

In step S11, the control unit 8 controls a substrate conveying mechanism (not shown) to convey the substrate 5 onto the substrate stage 6 (chuck 6a). In step S12, the control unit 8 sets a plurality of candidate conditions concerning a measurement condition for measuring the position of the mark 12 formed on the substrate 5. The measurement condition (candidate condition) can include, for example, an illumination condition when measuring the mark 12, the number and arrangement of the marks 12 to be measured, the number and arrangement of the sample shot regions 11a, and a signal processing algorithm for obtaining the position of the mark 12 from the mark signal 14. The plurality of candidate conditions set in step S12 can be different from each other in at least one of the above examples. Note that the measurement condition is not limited to the above examples.

In step S13, the control unit 8 causes the measurement unit 7 to detect light reflected by the mark 12 under one condition (target candidate condition) among the plurality of candidate conditions, thereby obtaining the mark signal 14 representing the intensity distribution of the reflected light from the measurement unit 7. In step S14, the control unit 8 obtains an evaluation index for evaluating the target candidate condition. In step S15, the control unit 8 determines whether to change the target candidate condition, that is, whether any candidate condition whose evaluation index has not been obtained exists. If the target candidate condition is determined to be changed, a candidate condition, among the plurality of candidate conditions, whose evaluation index has not been obtained is set as a target candidate condition, and steps S13 and S14 are performed. If the target candidate condition is determined not to be changed, the process advances to step S16. In step S16, the control unit 8 determines a measurement condition to be used when measuring the position of the mark 12 on the substrate 5 (that is, when executing actual measurement) based on the evaluation index obtained for each of the plurality of candidate conditions. The details of processes in steps S13, S14 and S16 will be described below.

[Obtaining Mark Signal (Step S13)]

Figure 8:
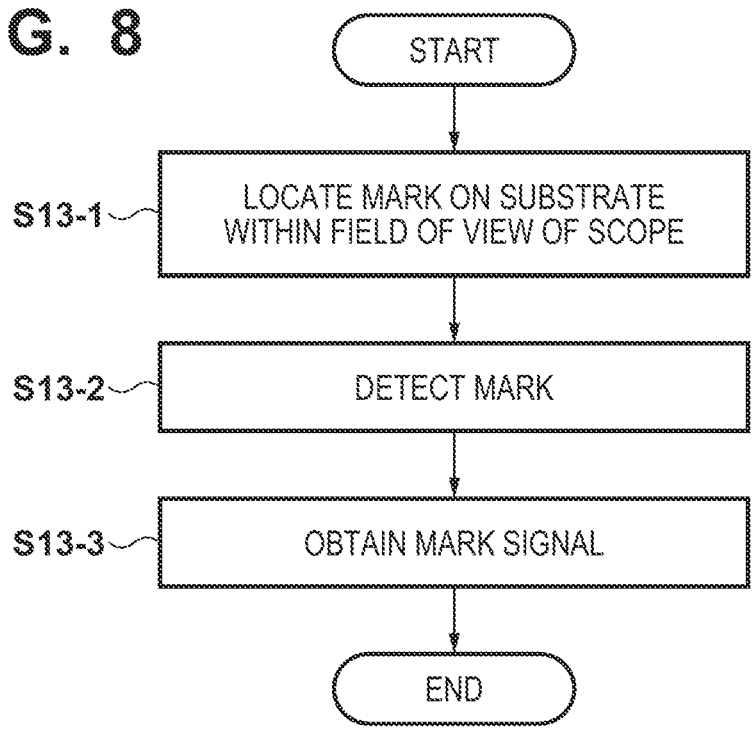
FIG. 8 is a flowchart showing a process for obtaining a mark signal.

The details of a process (step S13) for obtaining the mark signal 14 under a target candidate condition will be described with reference to FIG. 8. FIG. 8 is a flowchart showing a process for obtaining a mark signal.

In step S13-1, the control unit 8 positions the substrate stage 6 such that the mark 12 in the sample shot region 11a is located within the field of view of the scope of the measurement unit 7 under the target candidate condition. In step S13-2, the control unit 8 illuminates the mark 12 under an illumination condition set as the target candidate condition, and controls the measurement unit 7 (scope) to detect light reflected by the mark 12. In step S13-3, the control unit 8 obtains the mark signal 14 representing the intensity distribution of light reflected by the mark 12 detected by the measurement unit 7 (scope). In the mark signal 14 obtained in step S13, the peak values of the changing portions 14a to 14d can differ from each other because of the manufacturing process of the substrate 5, as described with reference to FIGS. 6A and 6B. The difference in peak value is detected as a noise component (a low-frequency component 15, a first signal component) of a low frequency (first frequency) having a period ¼ of which corresponds to the distance between the respective adjacent elements of the line elements 12a to 12d. The low-frequency component 15 can be approximated by a function (for example, a trigonometric function) that uses a signal level, period, and phase as parameters. In addition, it is known that among the low-frequency components 15 of the mark signals 14 obtained in the plurality of marks 12 on the substrate 5, the phase changes while the waveform remains unchanged.

[Calculating Evaluation Index (Step S14)]

Figure 9:
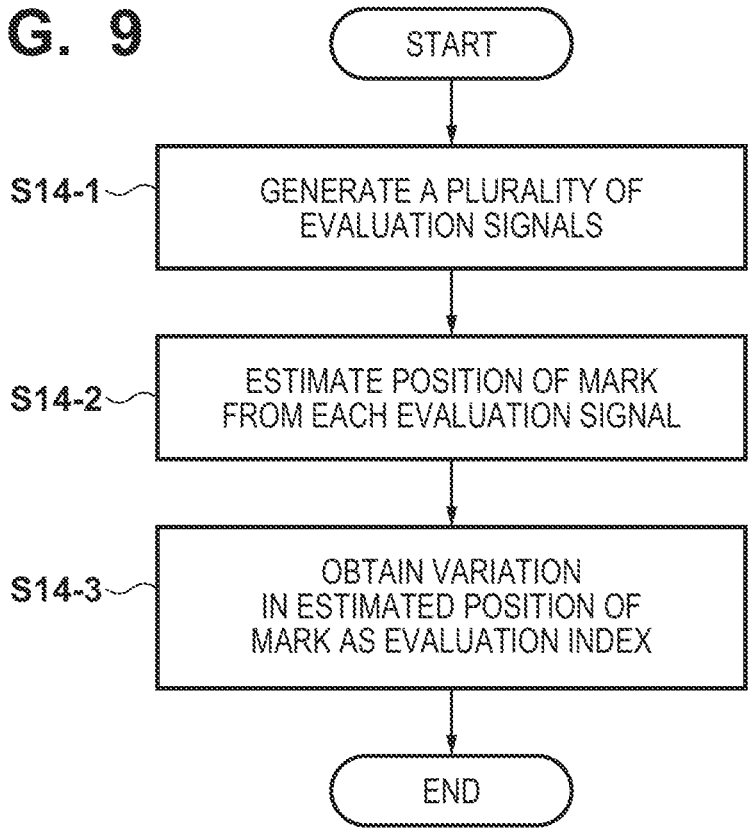
FIG. 9 is a flowchart showing a process for obtaining the evaluation index of a target candidate condition.

A process (step S14) for obtaining an evaluation index for evaluating a target candidate condition will be described in detail with reference to FIG. 9. FIG. 9 is a flowchart showing a process for obtaining the evaluation index of a target candidate condition.

Figure 10:
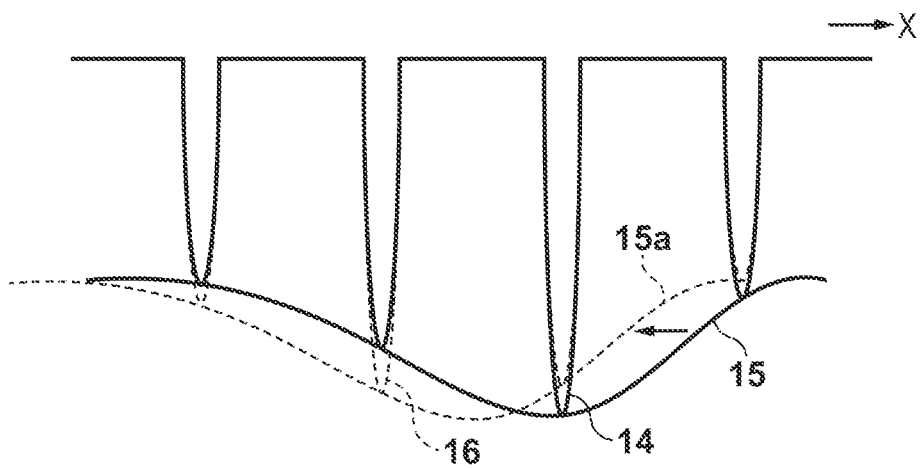
FIG. 10 is a view for explaining a process for generating a plurality of evaluation signals by changing the low-frequency component of the mark signal.

In step S14-1, the control unit 8 changes the low-frequency component 15 of the mark signal 14 obtained in step S13, thereby generating a plurality of evaluation signals for evaluating the target candidate condition. For example, as shown in FIG. 10, the control unit 8 extracts the low-frequency component 15 of the mark signal 14 obtained in step S13 by passing the mark signal 14 through a low-pass filter, and creates a pseudo component 15a by changing (shifting in a -X direction) the phase of the extracted low-frequency component 15. The pseudo component 15a is a pseudo low-frequency component, which is estimated to be included in a mark signal obtained from another mark. By combining the created pseudo component 15a with the mark signal 14 after extraction (removal) of the low-frequency component 15 (that is, changing the low-frequency component 15 of the mark signal 14 to the pseudo component 15a), an evaluation signal 16 as shown in FIG. 10 can be generated. When this process is repeatedly executed while changing the phase of the extracted low-frequency component 15 by a different amount, a plurality of evaluation signals can be generated. In this embodiment, a case in which a plurality of evaluation signals are generated by changing the phase of the extracted low-frequency component 15 is described, but the process is not limited to this. A plurality of evaluation signals may be generated by changing another parameter of the low-frequency component 15. The number of evaluation signals to be generated in step S14-1 can be set to the number that is enough for calculating the variation in estimated position of the mark 12 to be obtained as the evaluation index of the candidate condition in step S14-3 to be described later.

Figure 11:
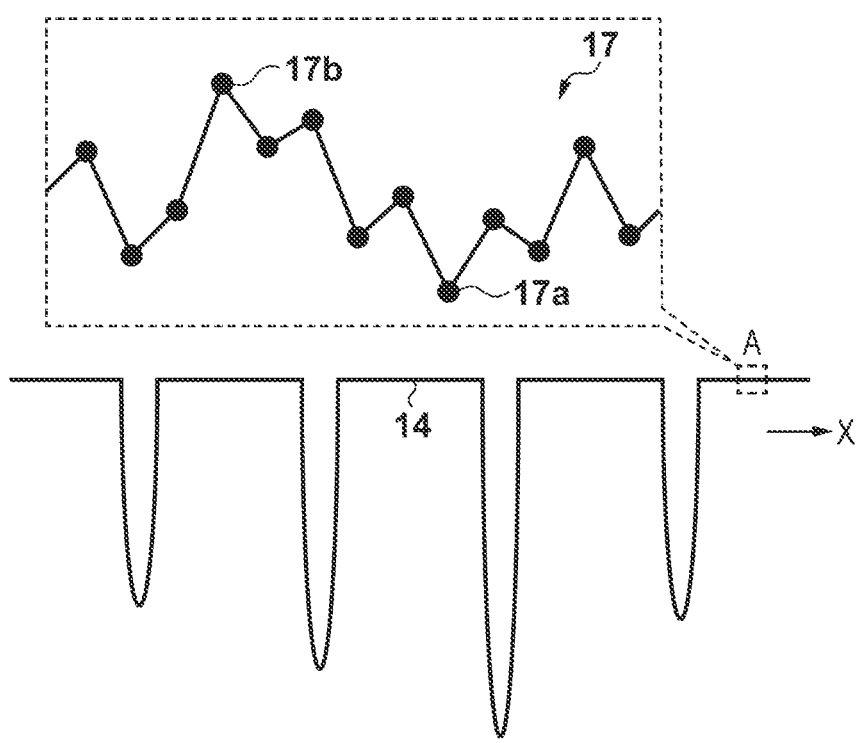
FIG. 11 is a view for explaining a process for generating a plurality of evaluation signals by changing the high-frequency component of the mark signal.

In the mark signal 14, a noise component (a high-frequency component 17, the second signal component) of a high frequency (the second frequency) may change depending on the detection timing of the mark 12 on the substrate 5. The high-frequency component 17 of the mark signal 14 can include environment noise (for example, a white noise component) such as electrical noise shown in a region A in FIG. 11. The change in the high-frequency component 17 of the mark signal 14 may cause a measurement error of the position of the mark 12 as well. Hence, the control unit 8 may generate a plurality of evaluation signals by changing the high-frequency component 17 of the mark signal 14.

For example, the control unit 8 extracts the high-frequency component 17 of the mark signal 14 obtained in step S13 by passing the mark signal 14 through a high-pass filter, and creates a pseudo component by changing the extracted high-frequency component 17. This pseudo component can be created as a uniform random number with the amplitude (for example, a local minimum value 17a and a local maximum value 17b) of the extracted high-frequency component unchanged. By combining the created pseudo component with the mark signal 14 after extraction of the high-frequency component 17 (that is, changing the high-frequency component 17 of the mark signal 14 to the pseudo component), an evaluation signal can be generated. When this process is repeatedly executed, a plurality of evaluation signals are generated. In this embodiment, the pseudo component concerning the high-frequency component of the mark signal 14 is created as a uniform random number, but the pseudo component is not limited to this. For example, a distribution representing the histogram of detection points between the local minimum value 17a and the local maximum value 17b may be obtained from the mark signal obtained in step S13, and a pseudo component may be created based on the obtained distribution.

In step S14-2, the control unit 8 estimates the position of the mark 12 based on each of the plurality of evaluation signals generated in step S14-1. That is, the control unit 8 estimates the position of the mark 12 based on each of the plurality of evaluation signals generated in step S14-1 by using a signal processing algorithm set as the target candidate condition, thereby obtaining a plurality (the same number as that of the evaluation signals) of estimated positions concerning the mark 12.

In step S14-3, the control unit 8 obtains the variation in estimated position of the mark 12 obtained in step S14-2 as the evaluation index of the target candidate condition. In this embodiment, a case in which a standard deviation σ is used as the variation (evaluation index) in estimated position of the mark 12 will be described. However, any value other than the standard deviation σ can be used as long as it can represent this variation. For example, when using n evaluation signals, the standard deviation σ of the estimated positions $x_n$ of a mark obtained from the evaluation signals can be expressed by $$\sigma = \sqrt{\frac{1}{n}\sum_{i=1}^{n}(x_i - x_{ave})^2}$$

where $x_{ave}$ is the average value of $x_n$. This standard deviation σ can be used as the evaluation index of the target candidate condition. In this way, the robustness of the candidate condition (measurement condition) can be evaluated by using the variation in estimated position of the mark 12 as the evaluation index.

[Determining Measurement Condition (Step S16)]

A process (step S16) for determining a measurement condition to be used when measuring the position of the mark 12 on the substrate 5 based on the evaluation index obtained for each of the plurality of candidate conditions will be described next. In step S16, the control unit 8 can determine, among the plurality of candidate conditions, a candidate condition having, for example, the smallest evaluation index (standard deviation σ) as the measurement condition.

Figure 12A:
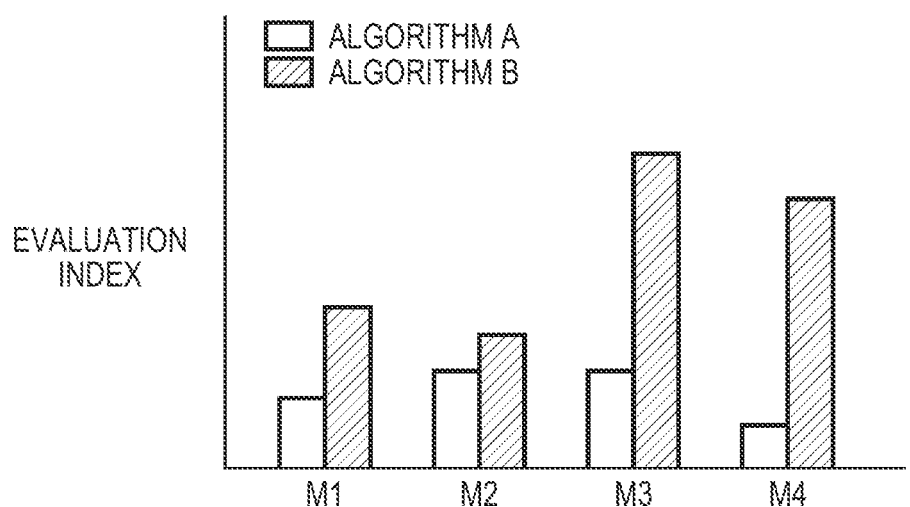
FIG. 12A is a view showing the evaluation indices of a plurality of candidate conditions obtained by a method of the present invention.
Figure 12B:
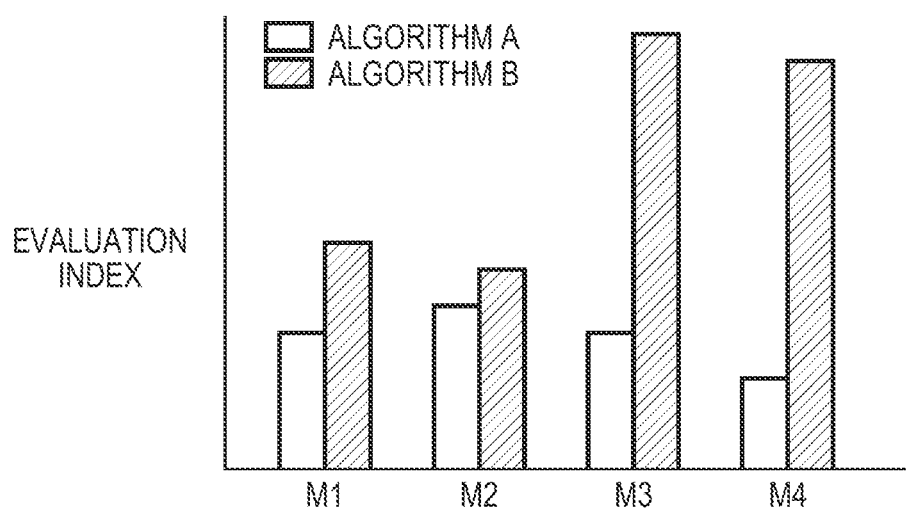
FIG. 12B is a view showing the evaluation indices of the plurality of candidate conditions obtained by a conventional method.

FIGS. 12A and 12B are views respectively showing the evaluation indices (standard deviations σ) of eight types of candidate conditions obtained by using a signal processing algorithm A and a signal processing algorithm B for each of a plurality of conditions M1 to M4 having different number or arrangement of the marks 12 whose positions to be measured. FIG. 12A shows an example in which the evaluation index (standard deviation σ) of each candidate condition is obtained using the above-described method according to this embodiment. FIG. 12B shows an example in which the evaluation index of each candidate condition is obtained in a conventional method from a result obtained by actually transferring the circuit pattern of the mask 2 on the substrate under each candidate condition. More specifically, FIG. 12B shows the evaluation index obtained from the variation in measurement value of the overlay errors between a transfer pattern and an underlying pattern obtained by performing alignment based on the position of the mark 12 measured under each candidate condition and actually transferring the circuit pattern of the mask 2 onto the substrate.

In the method according to this embodiment, as shown in FIG. 12A, among the eight types of candidate conditions, the standard deviation σ is smallest under the candidate condition that is a combination of the condition M4 and the signal processing algorithm A. The tendency of the standard deviation σ of each candidate condition is similar to that obtained from the actual measurement result of the overlay error as shown in FIG. 12B. That is, in the method according to this embodiment, each candidate condition can be evaluated by generating a plurality of evaluation signals based on the mark signal 14 as described above. Measurement of overlay errors need not be executed. Hence, a measurement condition can be determined quickly and readily.

Second Embodiment

The second embodiment according to the present invention will be described. The second embodiment is different from the first embodiment in that a process in step S14-1 of the flowchart of FIG. 9 is different. In the first embodiment, a plurality of evaluation signals are generated in a process of step S14-1 based on the mark signal 14 obtained in step S13. In the second embodiment, a plurality of evaluation signals generated based on not the mark signal 14 obtained in step S13 but a mark signal obtained in advance can be used.

More specifically, a plurality of evaluation signals are generated by changing the low-frequency component of a mark signal obtained in advance in the above-described method. The plurality of evaluation signals generated in this way are input via a console 9 provided in an exposure apparatus 10. In this case, a control unit 8 obtains the plurality of evaluation signals input via the console 9 in step S14-1. This also applies to a case of the high-frequency component of the mark signal. In the case of the high-frequency component, it is not limited to being obtained from the mark signal, but can be obtained from a signal (a signal without changing portions 14a to 14d) obtained by detecting light reflected by the surface of a substrate 5. Generation of the plurality of evaluation signals may be performed by the control unit 8 of the exposure apparatus 10, or may be performed by an external computer or the like of the apparatus.

<Embodiment of Article Manufacturing Method>

An article manufacturing method according to an embodiment of the present invention is suitable for manufacturing an article, for example, a microdevice such as a semiconductor device or an element having a microstructure. The article manufacturing method according to this embodiment includes a step of forming a pattern on a substrate using the above-described method, and a step of processing the substrate with the pattern formed in the step. The manufacturing method can also include other known steps (oxidation, deposition, vapor deposition, doping, planarization, etching, resist removal, dicing, bonding, and packaging). The article manufacturing method according to this embodiment is superior to a conventional method in at least one of the performance, quality, productivity, and production cost of the article.

<Other Embodiments>

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. An evaluation method of evaluating a measurement condition of a position of a mark formed on a substrate, the method comprising:
   obtaining a mark signal representing an intensity distribution of reflected light by detecting the reflected light from the mark under the measurement condition;
   generating a plurality of evaluation signals combining a plurality of first pseudo components with a first signal corresponding to the mark signal with a first frequency component removed therefrom, the plurality of first pseudo components being created by using different values of a first parameter of the first frequency component; and
   estimating positions of the mark from the plurality of generated evaluation signals, and obtaining a variation in the estimated positions of the mark as an evaluation index of the measurement condition.

2. The method according to claim 1, wherein the generating, removes the first frequency component, which is a low-frequency component, from the mark signal using a low-pass filter.

3. The method according to claim 1, wherein;
   the mark includes a line and space pattern formed from a plurality of line elements, and
   the first signal frequency component includes a noise component caused by a difference in intensity of reflected light between the plurality of line elements.

4. The method according to claim 1, wherein the generating creates the plurality of first pseudo components by changing a phase of the first frequency component as the first parameter of the first frequency component.

5. The method according to claim 1, wherein;
   the generating generates the plurality of evaluation signals by further combining a plurality of second pseudo components with a second signal corresponding to the mark signal with a second frequency component removed therefrom, the plurality of second pseudo components being created by using different values for a second parameter of the second frequency component, and
   a frequency of the second frequency component is higher than a frequency of the first frequency component.

6. The method according to claim 5, wherein the generating removes the second frequency component, which is a high-frequency component, from the mark signal using a high-pass filter.

7. The method according to claim 5, wherein the second frequency component is a white noise component removed from the mark signal.

8. The method according to claim 5, wherein the generating creates the plurality of second pseudo components by changing the second parameter of the second frequency component without changing amplitudes of the plurality of second pseudo components from an amplitude of the second frequency component.

9. A determination method of determining a measurement condition of a position of a mark formed on a substrate, the determination method comprising:
   setting a plurality of candidate conditions concerning the measurement condition;
   obtaining an evaluation index for each of the plurality of candidate conditions by an evaluation method; and
   determining the measurement condition based on the evaluation index obtained for each of the plurality of candidate conditions,
   wherein the evaluation method comprises:
      obtaining a mark signal representing an intensity distribution of reflected light by detecting the reflected light from the mark under one candidate condition among the plurality of candidate conditions;
      generating a plurality of evaluation signals by combining a plurality of pseudo components with a signal corresponding to the mark signal with frequency component removed therefrom, the plurality of pseudo components being created by setting different values for a parameter of the frequency component; and
      estimating positions of the mark from the plurality of generated evaluation signals, and obtaining a variation in the estimated positions of the mark as the evaluation index of the respective candidate condition.

10. A lithography apparatus for forming a pattern on a substrate, the apparatus comprising:
    a measurement unit configured to measure a position of a mark formed on the substrate; and
    a processing unit configured to determine a measurement condition of the position of the mark to be used by the measurement unit, wherein the processing unit:
       sets a plurality of candidate conditions concerning the measurement condition;
       obtains an evaluation index for each of the plurality of candidate conditions; and
       determines the measurement condition based on the evaluation index obtained for each of the plurality of candidate conditions, wherein the processing unit, in obtaining the evaluation index for each of the plurality of candidate conditions:
obtains a mark signal representing an intensity distribution of reflected light by detecting the reflected light from the mark under one candidate condition among the plurality of candidate conditions;
generates a plurality of evaluation signals by combining a plurality of pseudo components with a signal corresponding to the mark signal with a frequency component removed therefrom, the plurality of pseudo components being created by setting different values for a parameter of the frequency component; and
respectively estimates positions of the mark from the plurality of generated evaluation signals, and obtains a variation in the estimated positions of the mark as the evaluation index of the respective candidate condition.

11. A non-transitory computer-readable storage medium storing a program executable by a computer to execute an evaluation method of evaluating a measurement condition of a position of a mark formed on a substrate, the evaluation method comprising:
obtaining a mark signal representing an intensity distribution of reflected light by detecting the reflected light from the mark under the measurement condition;
generating a plurality of evaluation signals by respectively combining a plurality of pseudo components with a signal corresponding to the mark signal with frequency component removed therefrom, the plurality of pseudo components being created by setting different values for a parameter of the frequency component; and
estimating positions of the mark from the plurality of generated evaluation signals, and obtaining a variation in the estimated positions of the mark as an evaluation index of the measurement condition.

12. A non-transitory computer-readable storage medium storing a program executable by a computer to execute a determination method of determining a measurement condition of a position of a mark formed on a substrate, the method comprising:
setting a plurality of candidate conditions concerning the measurement condition;
obtaining an evaluation index for each of the plurality of candidate conditions by an evaluation method; and
determining the measurement condition based on the evaluation index obtained for each of the plurality of candidate conditions,
wherein the evaluation method comprises:
obtaining a mark signal representing an intensity distribution of reflected light by detecting the reflected light from the mark under one candidate condition among the plurality of candidate conditions;
generating a plurality of evaluation signals by combining a plurality of pseudo components with a signal corresponding to the mark signal with frequency component removed therefrom, the plurality of pseudo components being created by setting different values for a parameter of the frequency component; and
estimating positions of the mark from the plurality of generated evaluation signals, and obtaining a variation in the estimated positions of the mark as the evaluation index of the respective candidate condition.

13. A method of manufacturing an article, the method comprising:
setting a plurality of candidate conditions concerning a measurement condition of a position of a mark formed on a substrate;
obtaining an evaluation index for each of the plurality of candidate conditions by an evaluation method;
determining the measurement condition based on the evaluation index obtained for each of the plurality of candidate conditions;
measuring the position of the mark under the determined measurement condition; exposing the substrate based on a result of the measuring of the position of the mark; processing the exposed substrate; and manufacturing an article from the processed substrate,
wherein the evaluation method comprises:
obtaining a mark signal representing an intensity distribution of reflected light by detecting the reflected light from the mark under one candidate condition among the plurality of candidate conditions;
generating a plurality of evaluation signals by combining a plurality of pseudo components with a signal corresponding to the mark signal with a frequency component removed therefrom, the plurality of pseudo components being created by setting different values for a parameter of the frequency component; and
estimating positions of the mark from the plurality of generated evaluation signals, and obtaining a variation in the estimated positions of the mark as the evaluation index of the respective candidate condition.

* * * * *